US012599922B2

(12) United States Patent
Vukovic et al.

(10) Patent No.: US 12,599,922 B2
(45) Date of Patent: Apr. 14, 2026

(54) SYSTEM AND METHOD FOR LIQUID DISPENSE AND COVERAGE CONTROL

(71) Applicant: Tokyo Electron Limited, Tokyo (JP)

(72) Inventors: Mirko Vukovic, Albany, NY (US);
Daniel Fulford, Albany, NY (US);
Anton J. Devilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 393 days.

(21) Appl. No.: 18/490,409

(22) Filed: Oct. 19, 2023

(65) Prior Publication Data

US 2024/0042472 A1    Feb. 8, 2024

Related U.S. Application Data

(62) Division of application No. 17/196,189, filed on Mar. 9, 2021, now Pat. No. 11,883,837.

(60) Provisional application No. 63/019,017, filed on May 1, 2020.

(51) Int. Cl.
| | |
|---|---|
| *B05B 12/08* | (2006.01) |
| *G01B 11/06* | (2006.01) |
| *H01L 21/67* | (2006.01) |
| *G01N 21/55* | (2014.01) |
| *G01N 21/84* | (2006.01) |

(52) U.S. Cl.
CPC ........ *B05B 12/084* (2013.01); *G01B 11/0625* (2013.01); *H01L 21/6715* (2013.01); *H01L 21/67253* (2013.01); *G01N 2021/556* (2013.01); *G01N 2021/8427* (2013.01)

(58) Field of Classification Search
CPC .... G01B 11/0625; B05C 11/08; H01L 21/027
See application file for complete search history.

(56) References Cited

U.S. PATENT DOCUMENTS

| | | | |
|---|---|---|---|
| 5,891,352 A | * | 4/1999 | Litvak ................ G01B 11/0683 |
| | | | 216/88 |
| 6,508,990 B1 | | 1/2003 | Yoshida et al. |
| 6,919,913 B1 | | 7/2005 | Inada |
| 7,473,321 B2 | | 1/2009 | Koga |
| 7,659,968 B2 | | 2/2010 | Wang |

(Continued)

FOREIGN PATENT DOCUMENTS

| | | |
|---|---|---|
| CN | 1181135 A | 5/1998 |
| EP | 0 864 370 A1 | 9/1998 |

(Continued)

OTHER PUBLICATIONS

Combined Chinese Office Action and Search Report issued Nov. 6, 2025 in Chinese Patent Application No. 202180031784.2, 11 pgs.

(Continued)

*Primary Examiner* — Cachet I Proctor
(74) *Attorney, Agent, or Firm* — Oblon, McClelland, Maier & Neustadt, L.L.P.

(57) ABSTRACT

Light can be used to monitor coating a liquid on a substrate. By directing the light to a spot on the substrate, when the liquid passes through the spot, some light will be reflected, while some light will be scattered. Monitoring this behavior can indicate whether a substrate has been successfully coated with the liquid, as well as identifying defects. Further, coating times can be monitored to make process adjustments.

13 Claims, 11 Drawing Sheets

(56) References Cited

U.S. PATENT DOCUMENTS

| | | | | |
|---|---|---|---|---|
| 8,654,350 | B2 * | 2/2014 | Hamamatsu | G01N 21/9501 |
| | | | | 356/600 |
| 9,175,951 | B2 * | 11/2015 | El Gawhary | G03F 7/70625 |
| 9,645,097 | B2 * | 5/2017 | Nicolaides | G01N 21/9503 |
| 9,653,367 | B2 | 5/2017 | Maehr et al. | |
| 10,651,064 | B2 | 5/2020 | Naohara et al. | |
| 10,946,411 | B2 | 3/2021 | DeVilliers | |
| 2002/0149765 | A1 | 10/2002 | Fujii et al. | |
| 2005/0141891 | A1 | 6/2005 | Tanaka | |
| 2005/0167264 | A1 * | 8/2005 | Sternbergh | H01J 37/32935 |
| | | | | 204/298.03 |
| 2007/0166030 | A1 * | 7/2007 | Lee | G05B 19/41865 |
| | | | | 396/611 |
| 2013/0107247 | A1 * | 5/2013 | Hamamatsu | G01B 11/303 |
| | | | | 356/600 |
| 2015/0330914 | A1 * | 11/2015 | Maleev | G01N 21/47 |
| | | | | 356/237.5 |
| 2015/0370175 | A1 | 12/2015 | Nicolaides et al. | |
| 2016/0217997 | A1 | 7/2016 | Takeishi | |
| 2016/0379900 | A1 * | 12/2016 | Maehr | H01L 21/67051 |
| | | | | 118/712 |
| 2019/0096720 | A1 * | 3/2019 | Naohara | G06T 7/001 |
| 2019/0217325 | A1 | 7/2019 | DeVilliers | |
| 2019/0217326 | A1 | 7/2019 | DeVilliers | |
| 2019/0217328 | A1 | 7/2019 | DeVilliers | |

FOREIGN PATENT DOCUMENTS

| | | | |
|---|---|---|---|
| JP | 9-85156 | A | 3/1997 |
| JP | 11-16810 | A | 1/1999 |
| JP | 2000-91295 | A | 3/2000 |
| JP | 2009-32887 | A | 2/2009 |
| TW | 201350211 | A | 12/2013 |
| WO | WO 2019/140423 | A1 | 7/2019 |

OTHER PUBLICATIONS

Combined Office Action and Search Report issued Nov. 18. 2024 in Taiwanese Patent Application No. 110115519 with English translation. 7 pgs.

International Search Report and Written Opinion issued Jul. 19, 2021 in PCT/US2021/024448, 8 pages.

Korean Office Action issued Feb. 6, 2025 in Korean Patent Application No. 10-2022-7041526 (with English Translation, 20 pages.

Japanese Office Action issued Nov. 19, 2024 in Japanese Patent Application No. 2022-566324 (with English translation), 6 pages.

* cited by examiner

SYSTEM AND METHOD FOR LIQUID DISPENSE AND COVERAGE CONTROL

CROSS REFERENCE TO CO-PENDING APPLICATION

This application is a Divisional of U.S. patent application Ser. No. 17/196,189, filed Mar. 9, 2021, which claims priority to U.S. Provisional Patent Application No. 63/019, 017 filed May 1, 2020, the contents of which are incorporated herein by reference.

BACKGROUND

The present disclosure relates to semiconductor manufacturing and particularly to dispensing materials on a substrate.

Semiconductor manufacturing includes several processing steps that involve depositing liquid or fluid on a substrate. These processing steps include, among others, coating a wafer, developing a latent pattern, etching material on a wafer, and cleaning/rinsing a wafer.

In a routine microfabrication process, a thin layer of light-sensitive material, such as photoresist (i.e. resist), is coated on a working surface (upper surface) of a substrate. The light-sensitive material is subsequently patterned via photolithography to define a mask pattern for transferring to an underlying layer by etching and by using the patterned resist as an etch mask. Patterning of the light-sensitive material generally involves steps of coating, exposure, and development. A working surface of the substrate is coated with a thin film of light-sensitive material. The thin film of light-sensitive material is exposed to a radiation source through a reticle (and associated optics) using, for example, a micro-lithography system. Patterned exposure is followed by a development process during which the removal of soluble regions of the light-sensitive material occurs using a developing solvent. Soluble regions could be irradiated or non-irradiated regions depending on a tone of photoresist and developer used.

During the coating process, a substrate is positioned on a substrate holder and is rotated at high speed while resist solution is dispensed on an upper surface of the substrate. High rotation speeds can be several thousand of revolutions per minute (rpm). When, for example, the resist solution is dispensed at the center of the substrate, the resist solution spreads radially across the substrate due to centrifugal forces imposed by the substrate rotation. Wet etch and cleaning processes can be similarly executed. In a development process, a solvent developer is deposited on a substrate that is rotated at a high speed. The solvent developer dissolves soluble portions of the photoresist, and then the developer and dissolved photoresist are removed radially across the substrate due to centrifugal forces. Wet etch processes, cleaning process, and rinsing processes are executed similarly to a development process in that a liquid is deposited on a rotating wafer and removed by centrifugal forces to clear or clean off a particular material or residue.

SUMMARY

This disclosure presents a method for dispensing liquid on substrate. The method comprises rotating a substrate on a substrate holder about an axis; dispensing a liquid on a working surface of the substrate while the substrate is being rotated on the substrate holder, rotation of the substrate causing the liquid to coat the working surface of the substrate progressing from a center portion of the substrate to an edge of the substrate; directing a first laser beam at an edge of the working surface of the substrate; directing a second laser beam at an interior portion of the working surface of the substrate; monitoring scattered light from the first laser beam directed at the edge of the working surface of the substrate and scattered light or reflected light from the second laser beam directed at the interior portion of the working surface of the substrate to identify a pattern of monitored light indicating that the liquid has reached the edge of the working surface of the substrate; identifying an actual coating time of the liquid beginning from initiation of dispensing the liquid on the working surface until the liquid reaches the edge of the working surface; and comparing the actual coating time of the liquid to an expected coating time of the liquid.

In one embodiment, monitoring the scattered light from the first laser beam directed at the edge of the working surface of the substrate includes monitoring the scattered light and reflected light from the first laser beam at the edge of the working surface of the substrate.

In one embodiment, the method further comprises adjusting the given dispense operation based on comparing the actual coating time of the liquid to the expected coating time of the liquid.

In one embodiment, the method further comprises in response to identifying a difference greater than a predetermined threshold between the actual coating time and the expected coating time, adjusting the given dispense operation.

In one embodiment, adjusting the given dispense operation can include dispensing more of the liquid.

In one embodiment, adjusting the given dispense operation can include increasing rotational velocity of the substrate.

In one embodiment, the method further comprises in response to identifying a difference greater than a predetermined threshold between the actual coating time and the expected coating time, indicating an error.

In one embodiment, the method further comprises comprising monitoring multiple dispenses of multiple spin-on films and comparing actual coating time and expected coating time of each deposited film.

In one embodiment, the method further comprises monitoring light from the first laser beam directed at the edge of the working surface of the substrate to identify the pattern of monitored light indicating that a film formed from the liquid has a defect.

In one embodiment, monitoring the scattered light from first laser beam at the edge of the working surface of the substrate includes monitoring light from multiple light sources.

This disclosure also presents a method for dispensing liquid on substrate. The method comprises rotating a substrate on a substrate holder about an axis; dispensing a liquid on a working surface of the substrate while the substrate is being rotated on the substrate holder, rotation of the substrate causing the liquid to coat the working surface of the substrate progressing from a center portion of the substrate to an edge of the substrate; directing a first laser beam at an edge of the working surface of the substrate; directing a second laser beam at an interior portion of the working surface of the substrate; monitoring reflected light from the first laser beam directed at the edge of the working surface of the substrate and scattered light or reflected light from the second laser beam directed at the interior portion of the working surface of the substrate to identify a pattern of monitored light indicating that the liquid has reached the edge of the working surface of the substrate; identifying an actual coating time of the liquid beginning from initiation of dispensing the liquid on the working surface until the liquid reaches the edge of the working surface; and comparing the actual coating time of the liquid to an expected coating time of the liquid.

In one embodiment, monitoring the reflected light from the first laser beam directed at the edge of the working surface of the substrate includes monitoring the reflected light and scattered light from the first laser beam at the edge of the working surface of the substrate.

This disclosure also presents a method for dispensing liquid on a substrate, the method comprising: rotating a substrate on a substrate holder about an axis; dispensing a liquid on a working surface of the substrate while the substrate is being rotated on the substrate holder, rotation of the substrate causing the liquid to coat the working surface of the substrate progressing from a center portion of the substrate to an edge of the substrate; directing a laser beam at an edge of the working surface of the substrate; monitoring both scattered light from the laser beam and reflected light directed at the edge of the working surface of the substrate to identify a pattern of monitored light indicating that the liquid has reached the edge of the working surface of the substrate; identifying an actual coating time of the liquid beginning from initiation of dispensing the liquid on the working surface until the liquid reaches the edge of the working surface; and comparing the actual coating time of the liquid to an expected coating time of the liquid.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
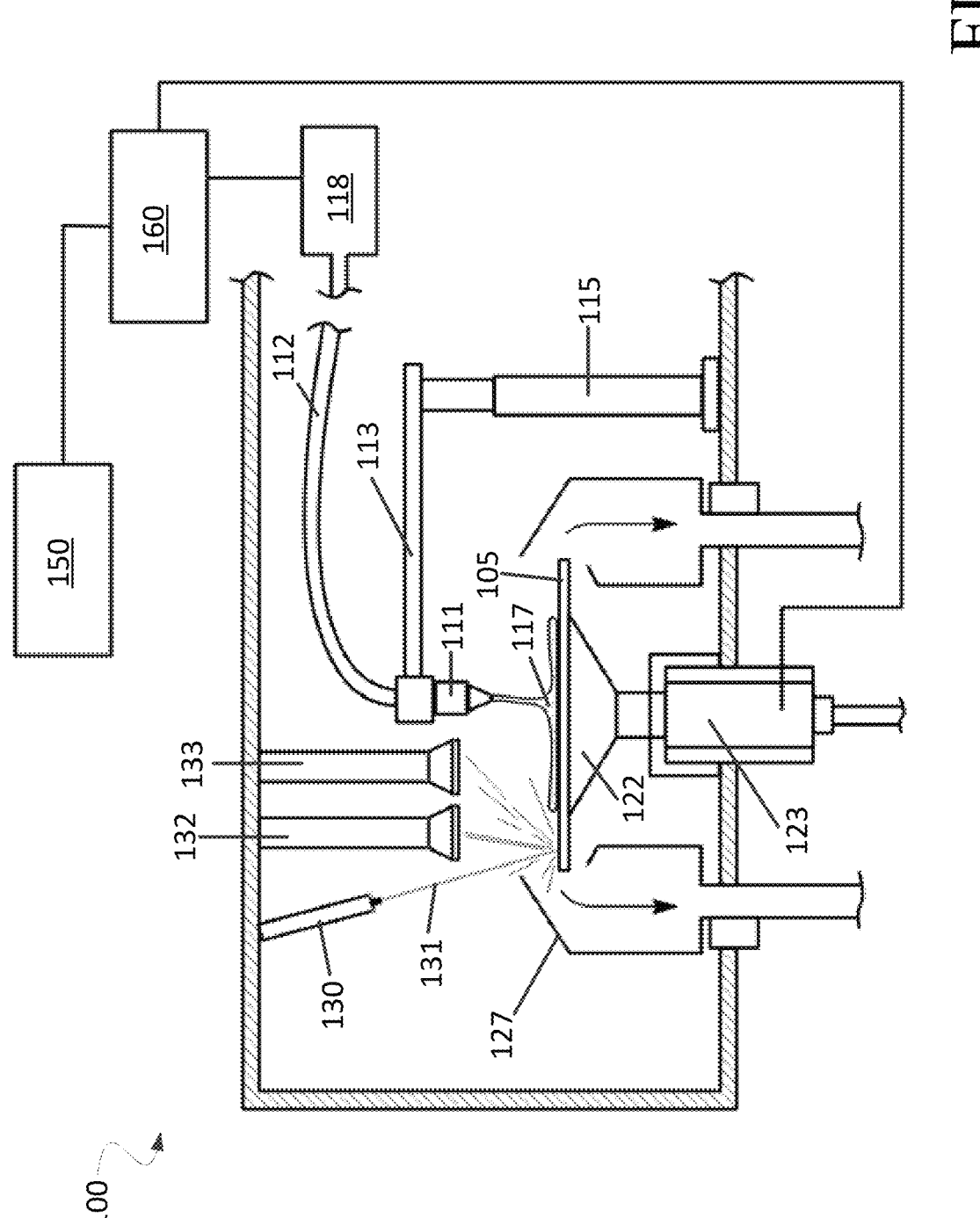
FIG. 1 is a cross-sectional schematic view of an example dispense system according to embodiments disclosed herein.

Techniques herein include systems and methods for dispending liquids on a substrate with real-time coverage and removal control. Techniques herein are applicable to various manufacturing operations including coating of substrates (such as semiconductor wafers), development of films, wet etching of materials, and cleaning and rinsing of substrates. Various embodiments use a laser beam light directed at one or more predetermined locations on the substrate to monitor behavior of scattered and/or reflected light from those one or more predetermined locations. Monitoring this scattered/reflected light behavior can indicate location of a given liquid on a working surface of a substrate when the liquid interacts with the laser beam, and can then flag the substrate as defective or generate feedback data for modifying a corresponding dispense operation in real-time, such as by increasing/decreasing a dispensed volume of fluid or increasing/decreasing a rotation velocity of the substrate. Monitoring can be manual or automated.

Although there are various manufacturing operations that involve liquid material dispensed on a rotating substrate, description of example embodiments will primarily focus on coating a substrate for convenience in describing techniques herein. Routing, conventional microfabrication techniques involve photolithography in which a film (photoresist) is coated on a substrate, exposed to a pattern of actinic radiation, and then developed to remove soluble material.

Conventionally, more photoresist (i.e. resist) is dispensed than what is needed to fully cover a substrate. The extra or overage of resist is dispensed to ensure that the entire substrate is evenly coated. A substrate (typically a semiconductor wafer) is spun at relatively high speed (rotational velocity) while liquid resist is dispensed on to a working surface of the wafer. The spinning wafer then uses centrifugal force to push the resist to the edge of the substrate (typically a circular wafer). A given resist, developer, or other fluid has a line of progression that does not always have a uniform edge. That is, a photoresist does not have an outer edge or outer meniscus that evenly spreads radially, such as a perfect circle evenly expanding. Instead, the outer edge of the photoresist is not uniform and certain areas of the photoresist can reach the edge of the substrate prior to other areas. The result can appear as jagged edges of photoresist at the edge of a substrate. This incomplete coverage is not visible while the substrate is rotating. Instead, a rotating substrate can appear to be fully coated when rotated due to blurring of the liquid.

One approach for coverage control is visually monitoring progression of a coating liquid across a substrate, such as with a stroboscope or camera. Visually monitoring can be effective with some liquids and film thicknesses, but less effective with others. For example, some photoresists and films have a coverage thickness on the order of tens of nanometers. A film of this thickness is relatively thin and can result in being essentially transparent. Accordingly it becomes difficult to visually determine when a wafer is fully coated with a given film. Monitoring with scattered/reflected light can overcome such problems.

For many applications a uniform and full coating of photoresist on the working surface of the substrate is required. To meet this requirement, extra resist is dispensed so that the spinning substrate can become fully coated. The extra resist falls off the edge of the wafer and is wasted resist. Conventionally, manufactures may deposit as much as 400% or more extra of photoresist and other liquid chemistry as a factor of safety to account for several different variables that can affect full coverage. One factor is a dispense capability of a dispense system itself. For example, some photoresist compositions can coat a substrate with approximately 0.2 cc of resist. Due to dispense variables, it is common for approximately 0.8 cc of resist to be dispensed.

There are various factors or variables that contribute to the excess fluid that is dispensed. Some factors relate to the capability of the dispense system itself. This includes variability in valve response, conduits, measurement means, et cetera. Another factor is performance of a given photoresist or liquid chemistry. With slight variations in photoresist composition, even within a same chemical formula a given amount of liquid dispensed can have more or less viscosity at any given dispense. A variation in viscosity needs to be addressed and usually contributes to increasing an amount of safety stock by dispensing more chemistry. Another factor affecting coverage is physical properties of the substrate surface itself. During the fabrication of semiconductor devices on wafers, there are different materials used at different stages of fabrication. Moreover, the surface topography can differ depending on stage of fabrication as well as type of devices being fabricated (for example, memory versus logic). A given material and/or topography can increase viscosity of a photoresist spreading across this surface. Wettability of a substrate is a significant factor because there can be substantial variations in the interaction of a liquid with the substrate. This interaction routinely causes deviation of liquid flow across the substrate. When these factors of safety are compounded, manufactures may then use substantially more chemistry then what is actually needed for full coverage. Some manufacturers can run four times or more extra volume as compared to what is actually needed.

Note that because a given photoresist coating a substrate reaches a substrate edge at different rates, there is typically an amount of safety stock required for complete coverage. This minimum extra photoresist is usually around 2-20% extra. Thus, a given substrate can by calculation be fully coated with 102-120% of resist actually needed to be deposited for full coverage. Because of the various performance factors, however, manufacturers routinely deposit 300% to 500% more of photoresist (or developer) than what is actually needed. The extra is just safety stock. It is an amount not required to coat/rinse the substrate, but simply included to make sure a substrate never results in a partial coating.

Techniques herein include a spin-on dispense process sensor and defect monitor for coverage control for depositing spin-on films on a substrate, such as a semiconductor wafer. Each substrate can be characterized by behavior of scattered and/or reflected light from a laser beam directed to a predetermined location on the substrate when it interacts with the liquid. For example, to detect that a liquid has fully covered a substrate, the laser can be directed to the substrate's edge. Liquid that has been dispensed near the center of the rotating substrate will progressively begin to cover the substrate as it flows outwards towards the laser/substrate's edge. When the edge of the liquid and laser beam interact, there will be a momentary change in behavior of scattered and reflected light, which can be detected by one or more optical detectors for detecting scattered and/or reflected light, and indicate the liquid's progress/substrate's coverage. Additional lasers or other types of light sources can target other areas of the substrate for further progress/coverage information. The system can flag the substrate as defective if it doesn't have proper liquid coverage, or the system can use a feedback control loop (such as Advanced Process Control (APC)) to make sure than an exact amount of volume is deposited, which significantly reduces a volume of safety stock dispensed. Thus, instead of having a safety stock that is 300% or 400% or 500% more than what is needed, the system and methods herein can deposit a photoresist, developer or other liquid with an overage less than 50%, 20%, or even 2% extra. This can eliminate waste, reduce a need for chamber cleaning, and reduce tool downtime. Each substrate being processed by liquid deposition can be monitored in real-time with one or more optical detectors for detecting reflected and/or scatter light, and can map points in time along an edge of a liquid moving across the substrate each time it interacts with a laser beam. This edge can be an outer edge of a liquid coating the substrate, or an inner edge of liquid clearing off of the substrate.

Based on analysis of liquid progression or behavior, some actions or modifications to the dispense system can be made. For example, in some dispenses it can be observed that the photoresist progresses relatively quickly and moves over the edge of the substrate for an early coating. With the system tracking a coating progression and identifying when a coating is complete (or will be complete by identifying rate of progression), the system can indicate (provide feedback) when or at what point a full coat is achieved or will be achieved to cease dispensing a liquid. If the system observes or determines that the edge of the resist is slowing down and moving slowly, then action can be taken to accelerate rotation of the substrate holder and/or dispense additional resist onto the substrate to achieve full coating or wetting.

Conventionally, analysis of coating performance occurs after a coating process. Basically a substrate is stopped from rotation or removed from a processing chamber to inspect coat coverage. To the unaided eye, coating progress may look uniform as non-uniformities are blurred with high-speed rotation. Techniques herein, however, provide a real-time look at a substrate coat's future, as well as the capability of that coat by looking at data on the scattered or reflected light and optionally applying that data as real-time feedback, such as to identify a dispense or rotation stopping point. A processor can be connected to the scattered or reflected light detectors, and can analyze scattered/detected light to ascertain whether a given dispense was acceptable or not, ascertain whether a coating is needed, to collect process statistics (e.g. yield statistics), or to make adjustments to spin speed and dispense speed/amount. Such controls can adjust to variable process conditions in real-time. Thus, instead of estimating a substrate's wettability and a photoresist's viscosity to calculate a safe dispense amount and spin time, photoresist can be deposited on a rotating substrate without initially knowing a stopping point. As the photoresist spreads across the substrate, the processor receiving scattered and/or reflected light data on this progression can identify a progression rate as a function of time and can then accurately indicate a stopping point. Accordingly, knowing substrate wettability and photoresist viscosity is not required because the system can stop a given coating operation when a substrate is fully coated. In other words, instead of estimating a stop time and estimating a volume of liquid to be dispensed, a precise dispense volume and stop time can be calculated in real-time based on scattered/reflected light observations indicating liquid progression.

In some embodiments, an initial substrate can have a fluid dispensed thereon, and then scattered/reflected light data are used to identify a spin and dispense time needed for a full coat. This dispense time and volume data can then be used for subsequent dispenses.

In some embodiments, statistics on deposition yield as a function of process conditions (including dispense volume, spin speed profile, and others) can be collected. Dispense process can be defined based on statistics and a desired process yield. During production, deposition yield statistics can continue to be collected and monitored for process drifts. In production (including high volume manufacturing (HVM)), deposition yield can continue to be monitored and the process adjusted to ensure coating processes fall within a specification, thereby continuously correcting process or environment drifts. When defects are detected in HVM, the substrate can be immediately sent for rework. Process matching via coverage yield allows the system to take into account variations and counteract the effects of tool variability (such as process bowls, dispense systems, et cetera), environmental effects (fab temperature, humidity), chemical variability, drifts (bottle to bottle or shelf-time effects), et cetera.

Techniques herein measure scattered light and/or reflected light from the substrate, and detect passage of the front of the spreading liquid. It can also detect radial striation type defects. The sensor can therefore determine whether a particular deposition was successful or not.

Techniques herein will now be described with respect to the accompanying drawings. Referring to FIG. 1, system 100 is a system for dispensing liquid 117 on a substrate 105. Substrate holder 122 is configured to hold substrate 105 and rotate substrate 105 about an axis. Motor 123 can be used to rotate the substrate holder 122 at a selectable rotational velocity. A dispense unit 118 is configured to dispense liquid on a working surface of the substrate 105 while the substrate 105 is being rotated by the substrate holder 122. Dispense unit 118 can be positioned directly over a substrate holder, or can be positioned at another location. If positioned away from the substrate holder, than a conduit 112 can be used to deliver fluid to the substrate. The fluid can exit through nozzle 111. FIG. 1 illustrates liquid 117 being dispensed onto a working surface of substrate 105. Collection system 127 can then be used to catch or collect excess liquid 117 that spins off substrate 105 during a given dispense operation.

Dispense components can include nozzle arm 113 as well as support member 115, which can be used to move a position of nozzle 111 across the substrate 105, or to be moved away from the substrate holder 122 to a resting location, such as for rest upon completion of dispense operations. The dispense unit 118 can alternatively be embodied as a nozzle itself. Such a nozzle can have one or more valves in communication with system controller 160. The dispense unit 118 can have various embodiments configured to control dispense of a selectable volume of fluid on a substrate.

The dispense unit 118 can be embodied using various technologies. Various valves, flow controllers, filters, nozzles, et cetera can be used. The various dispense technology selected for use can provide various levels of volume control and delay. Techniques here can benefit from precise volume control by using a bladder-based dispense unit such what is described in US Patent Application Publication No. 2018/0046082 (U.S. Ser. No. 15/675,376) entitled "High-Purity Dispense Unit." Such a precise dispense system, however, is not required. Accordingly, techniques can be practiced herein with conventional dispense systems.

The dispense unit can be configured to dispense selective amounts of photoresist, negative tone developer, or other liquid on the substrate based on input from the system controller. The dispense unit can include a dispense nozzle positioned above the working surface of the substrate.

System 100 includes at least one laser 130 configured to send a laser beam 131 to a predetermined location (i.e. target) on the substrate 105. The laser 130 can be a laser diode or light emitting diode with beam forming optics. The predetermined location can be where knowledge on liquid 117 coverage progression or defect detection is desired. Various predetermined locations can be used herein. For example, to know if the entire substrate 105 has been covered by liquid 117, laser 130 can be configured to direct the laser beam 131 to the edge (or within a few millimeters of the edge) of the substrate 105. In another embodiment, more than one laser 130 can be used. For instance, a second laser beam can be directed between the edge and center portion of the substrate 105 to monitor intermediate progress of liquid 117. In another embodiment, a different light source can be used instead of or in addition to laser beam 131. Any laser (such as green or red) can be used as long as it does not activate a given photoresist being dispensed Reflected light detector 132 is positioned to capture reflected light from laser beam 131. When laser beam 131 hits and reflects off the predetermined location on the substrate 105, if that predetermined location is smooth, the majority of laser beam 131 will be reflected to and detected by the reflected light detector 132 (rather than the scattered light detector 133). The predetermined location being smooth can indicate that location has not been covered by liquid 117 yet, or that the location has been successfully covered by liquid 117. Note than more than one reflected light detector can be used. For example, if a first laser beam is directed to the edge of a substrate, a first reflected light detector can be used to detect reflected light from the edge of the substrate. If a second laser beam is directed to an interior portion of the substrate, a second reflected light detector can be used to detect reflected light from the interior portion of the substrate.

Scattered light detector 133 is positioned to capture scattered light from laser beam 131. When an edge of liquid 117 interacts with laser beam 131, more light will be scattered and less light will be reflected. This edge of liquid 117 can be radially spreading liquid or slivers (mouse bites) on the substrate 105 that are not yet covered with liquid 117. Detecting an increase in scattered light (or decrease in reflected light) can indicate that liquid 117 has reached the predetermined location on the substrate 105, or that the substrate 105 has a defect. Note than more than one scattered light detector can be used. For example, if a first laser beam is directed to the edge of a substrate, a first scattered light detector can be used to detect scattered light from the edge of the substrate. If a second laser beam is directed to an interior portion of the substrate, a second scattered light detector can be used to detect scattered light from the interior portion of the substrate.

Note that in one embodiment, the system 100 has at least one detector to capture reflected light. In another embodiment, the system 100 has at least one detector to capture scattered light. A system 100 can have both a scatted light detector 133 and reflected light detector 132, but it is not always necessary.

The reflected light detector 132 and scattered light detector 133 can use conventional techniques to detect light. For example, the reflected light detector 132 and scattered light detector 133 can have a photodetector for detecting light. Furthermore, additional components can be placed in system 100 to direct laser beam 131, scattered light, and/or reflected light to their respective target locations. Example of such components can include mirrors, elliptical collectors, quarter wavelength plates, polarizing beam splitters, focus lenses, collimator/cylindrical lenses, etc. In one embodiment, a polarizing beam splitter is used to direct reflected light to a reflected light photodetector, while a primary mirror directs scattered light to a secondary mirror, and the secondary mirror directs the scattered light to a scattered light photodetector.

The detected scattered light and/or reflected light information can be transmitted to, or collected by, processor 150. Processor 150 is configured to examine scattered light and/or reflected light information received from scattered light detector 133 and/or reflected light detector 132. The processor 150 can flag a substrate if it has a defect (e.g. sliver). The processor 150 can also monitor coating times. Processor 150 can identify an actual coating time of liquid 117 beginning from initiation of dispensing the liquid 117 on a working surface of substrate 105 until the liquid reaches a predetermined location (e.g. edge, interior portion) of the working surface. Further, processor 150 can compare the actual coating time of liquid 117 to an expected coating time. The processor 150 can also be configured to generate feedback data while the substrate 105 is rotating with the liquid 117 thereon. By analyzing scattered and/or reflected light, the processor 150 can determine how complete edge propagation of fluid is, or determine de-wetting conditions among other things. This edge progression data can then be fed to system controller 160. System controller 160 is connected to the substrate holder 122 and connected to the dispense unit 118. The system controller 160 can be configured to adjust a volume of the liquid dispensed onto the working surface of the substrate based on the feedback data while the substrate is rotating with the liquid 117 thereon. For example, a purpose-built or an APC control loop or feedback control loop connected to the system controller 160 is arranged to control a corresponding dispense system and/or substrate spinning mechanism.

One or more scattered light detectors and/or reflected light detectors are position to detected scattered and reflected light, respectively. A processor 150 is connected to, or accessible by, the system 100 and is configured to analyze scattered light and/or reflected light received from their respective detectors. The processor 150 can be configured to generate feedback data while the substrate 105 is rotating with the liquid 117 thereon. Feedback data can also be generated and provided after dispense operations. The processor 150, based on examination of scattered and/or reflected light can also be configured to monitor a coating progression of photoresist across the working surface of the substrate 105 and generate the feedback data indicating when sufficient photoresist has been dispensed for full coverage of the working surface of the substrate 105. This indication can be anticipatory based on a progression rate.

The processor 150 can be configured to identify a pattern of scattered and/or reflected light indicating that the liquid 117 has reached the target location on the substrate 105 or that a film formed from the liquid 117 has a coverage defect. A steady state behavior of the scattered and reflected light can indicate that a liquid 117 has not reached the target location (i.e. location of laser beam 131) yet, or that the target location has been successfully covered. Spikes/non-steady state behavior of the scattered or reflected light can indicate that the edge of liquid 117 has just reached the target location, or that a coverage defect is present. Examples of such behaviors will be shown later on in this disclosure.

A system controller 160 is connected to the substrate holder 122 and connected to the dispense unit 118. The system controller 160 is configured to adjust a volume of the liquid 117 dispensed onto the working surface of the substrate 105 based on the feedback data while the substrate 105 is rotating with the liquid 117 thereon. The system controller 160 can be further configured to adjust a rotational velocity of the substrate holder 122 based on the feedback data.

The system controller 160 can be configured to dispense an initial volume of the liquid 117 on the working surface of the substrate, and then dispense an additional volume of the liquid 117 on the working surface of the substrate 105, the additional volume of the liquid 117 being sufficient to complete full coverage of the liquid 117 on the working surface of the substrate 105. In other words, more fluid can be dispensed when it is determined that more is needed to fully cover a wafer.

The system controller 160 can be configured to increase a rotational velocity of the substrate holder 122 based on the feedback data indicating insufficient coverage of the liquid 117 on the working surface of the substrate 105. Such an increase in rotational velocity can help to spread a film across the substrate 105. The system controller 160 can alternatively decrease a rotational velocity of the substrate holder 122 based on the feedback data that indicates, for example, a turbulent condition of the liquid 117 on the working surface of the substrate 105 or excess resist being flung from the substrate 105. The system controller 160 can increase the volume of the liquid 117 dispensed on the working surface of the substrate 105 based on the feedback data indicating insufficient coverage of the liquid 117 on the working surface of the substrate 105.

The processor 150 can have many functions. The processor 150 can be configured to generate the feedback data while the substrate 105 is rotating with the liquid 117 thereon, and a given dispense operation can be adjusted while the substrate 105 is rotating with the liquid 117 thereon. Based on examination of the scattered or reflected light indicating location/movement of the liquid 117, the processor 150 can monitor progression of an outer meniscus of the liquid 117 as the liquid 117 coats the working surface of the substrate 105. The processor 150 can also monitor progression of an inner meniscus of the liquid 117 as the liquid 117 is spun off the working surface of the substrate 105. Coating progression of the liquid 117 can be monitored to generate the feedback data indicating more or less volume of the liquid 117 to be dispensed to result in a minimum volume dispensed that results in the working surface of the substrate 105 being fully coated and/or identify when the working surface of the substrate 105 is fully covered.

The system controller 160 can be configured to take various actions. For example, the system controller 160 can adjust a volume of the liquid 117 dispensed onto the working surface of the substrate 105 based on the feedback data while the substrate 105 is rotating. A rotational velocity of the substrate holder 122 can be adjusted based on the feedback data. Based on gathered data indicating movement of the liquid 117, a volume of the liquid 117 dispensed can be less than 150 percent of a coverage volume needed to fully cover the working surface of the substrate 105. The system controller 160 can decrease a rotational velocity of the substrate holder 122 based on the feedback data indicating a turbulent conditional of the liquid 117 on the working surface of the substrate 105, which can prevent substrate 105 damage. The system controller 160 can also stop dispensing fluid in response to receiving the feedback data indicating that the working surface of the substrate 105 is fully covered.

A coating progression of an initial volume of the liquid 117 on the working surface of the substrate 105 can be monitored by the processor 150, and then generate the feedback data indicating insufficient coverage of the working surface of the substrate 105. Based on examination of the scattered and/or reflected light indicating proper coverage, the processor 150 can calculate a total volume of the liquid 117 dispensed on the substrate 105 to cover the substrate 105 with less than fifty percent excess volume. The processor 150 can also monitor and generate the feedback data indicating a de-wetting condition, and when sufficient photoresist has been dispensed for full coverage of the substrate 105. In response to receiving the feedback data indicating when sufficient photoresist has been dispensed for full coverage of the substrate 105, the system controller 160 can stop a dispense operation. The behavior of scattered and/or reflected can be analyzed to monitor progression of an outer meniscus of the liquid 117 as the liquid 117 coats the substrate, or an inner meniscus of the liquid 117 as the liquid 117 is spun off the substrate.

One embodiment includes a system for dispensing liquid on a substrate. The system includes a substrate holder configured to hold a substrate and rotate the substrate about an axis. A dispense unit is configured to dispense liquid on a working surface of the substrate while the substrate is being rotated on the substrate holder. At least one of a scattered light detector and reflected light detector is positioned to detect scattered or reflected light from a laser beam directed to the edge of a substrate.

With a high degree of accuracy, edges of liquid 117 can be tracked. This can help identify areas of insufficient coverage (sometimes termed "mouse bite" occurrences) or other non-uniform edge progression to make sure a substrate 105 is fully covered. For example, with respect to photoresist deposition to cover a substrate 105, a non-covered formation can occur at the edge of the photoresist progression. This non-covered area and its formation can then be tracked as a function of time prior to formation. Such tracking can help ensure a complete coat and minimize excess liquid 117 material. By tracking the leading edge of photoresist propagation as it is moving over the edge of the substrate 105, this progression can be tracked as a function of time during photoresist spinning. The processor 150 can then calculate a location of that function of time and then determine where the photoresist edge is and how close a given edge is to actually having a mouse bite occur. Identifying uncoated portions can then automatically trigger a response such as flagging the substrate 105 as defective, depositing incrementally more photoresist, or accelerating a rotational velocity to achieve full coverage. Such edge tracking can also be used to calculate a rate of progression in real time. The rate of progression can be used to identify or calculate when the photoresist fully covers (or will fully cover) the substrate 105 and thus this coverage rate can be used to indicate when to stop dispensing photoresist on the substrate.

Because of non-uniform propagation of liquid chemistry, a certain amount of liquid 117 overage is needed to fully cover a given substrate. 105 With accurate control, however, this overage can be as low as 2-50% extra material dispensed.

Figure 2:
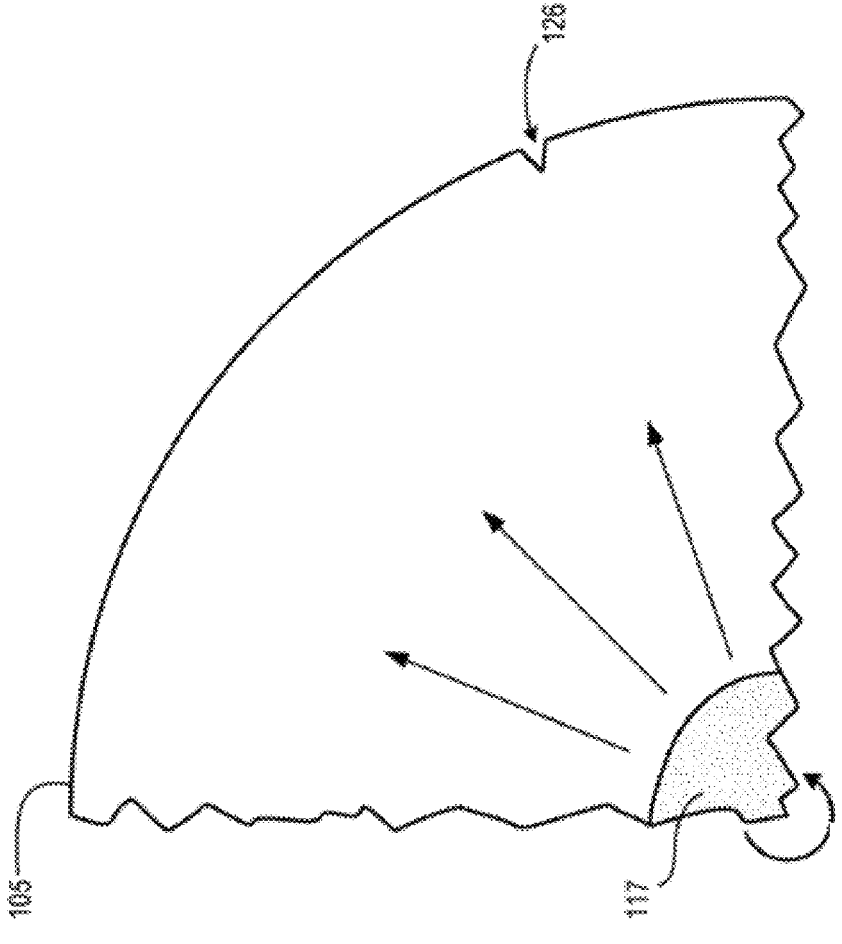
FIG. 2 is a top view of an example substrate segment showing flow of an example coating process according to embodiments disclosed herein.

FIG. 2 illustrates a top view of a substrate segment showing a working surface of the substrate 105. The substrate 105 is being rotated at a relatively high speed, such as 2-3 thousand revolutions per minute. It is common for semiconductor wafers to have a notch 126 or straight edge, at one location of the substrate. Sometimes this notch 126 is V-shaped, while other times it is a short, flat edge of an otherwise circular wafer. If the notch 126 interacts with laser beam 131, it can cause a change in scattered light and reflected light behavior. Knowing this, the laser beam 131 can be directed away from the notch 126, or the processor 150 can anticipate and filter out the scattered light/reflected light caused by the notch 126.

Figure 3:
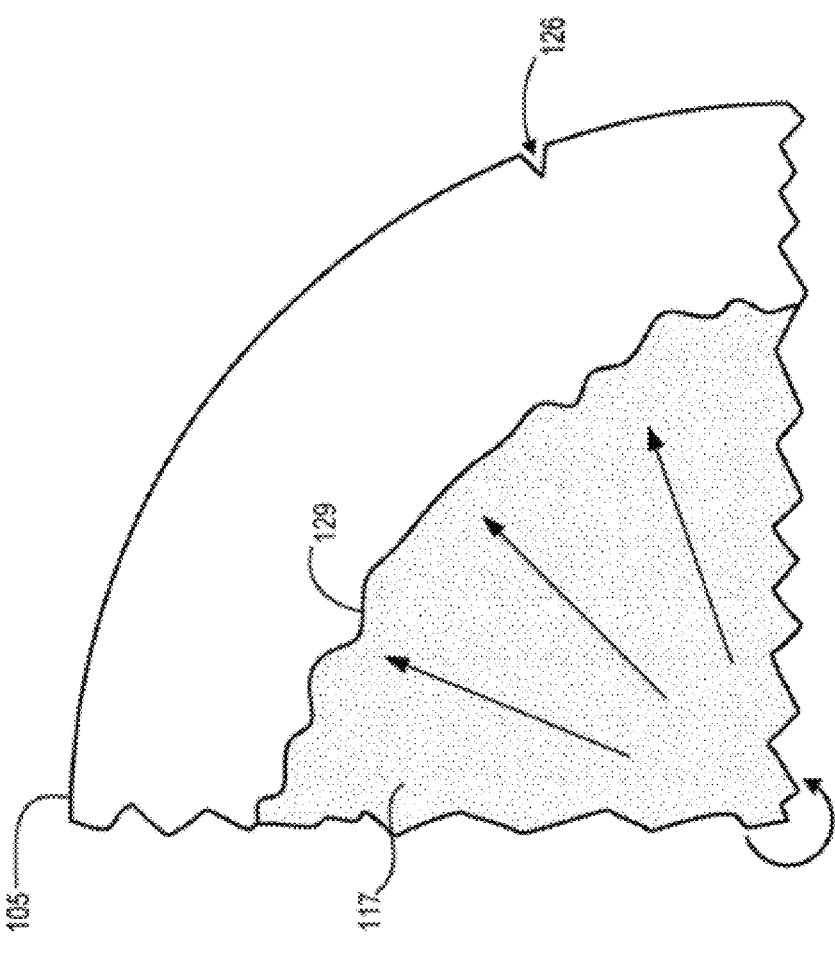
FIG. 3 is a top view of an example substrate segment showing flow of an example coating process according to embodiments disclosed herein.

In FIG. 2, liquid 117 is shown on a working surface of substrate 105. This can be, for example, a photoresist that is deposited at or near a center point of the substrate 105. As substrate 105 is rotated at a high-speed, liquid 117 spreads radially. FIG. 3 illustrates continued radial progression of liquid 117. Note that outer meniscus 129 has a non-uniform edge. In other words, liquid 117 does not spread evenly or perfectly evenly.

Figure 4:
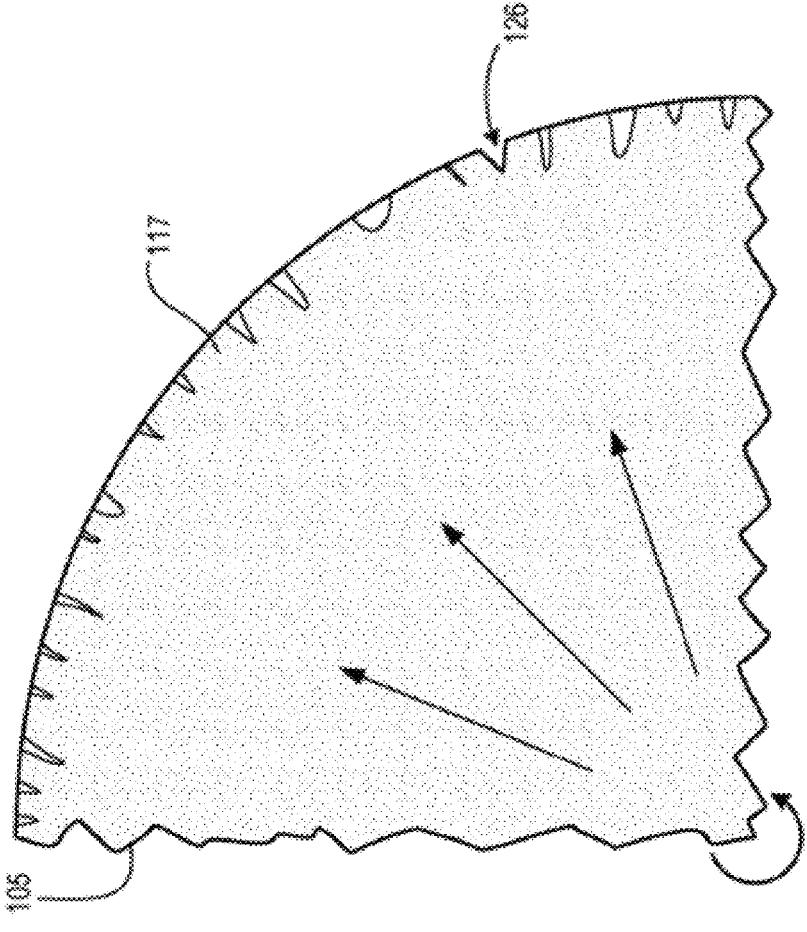
FIG. 4 is a top view of an example substrate segment showing flow of an example coating process according to embodiments disclosed herein.
Figure 5:
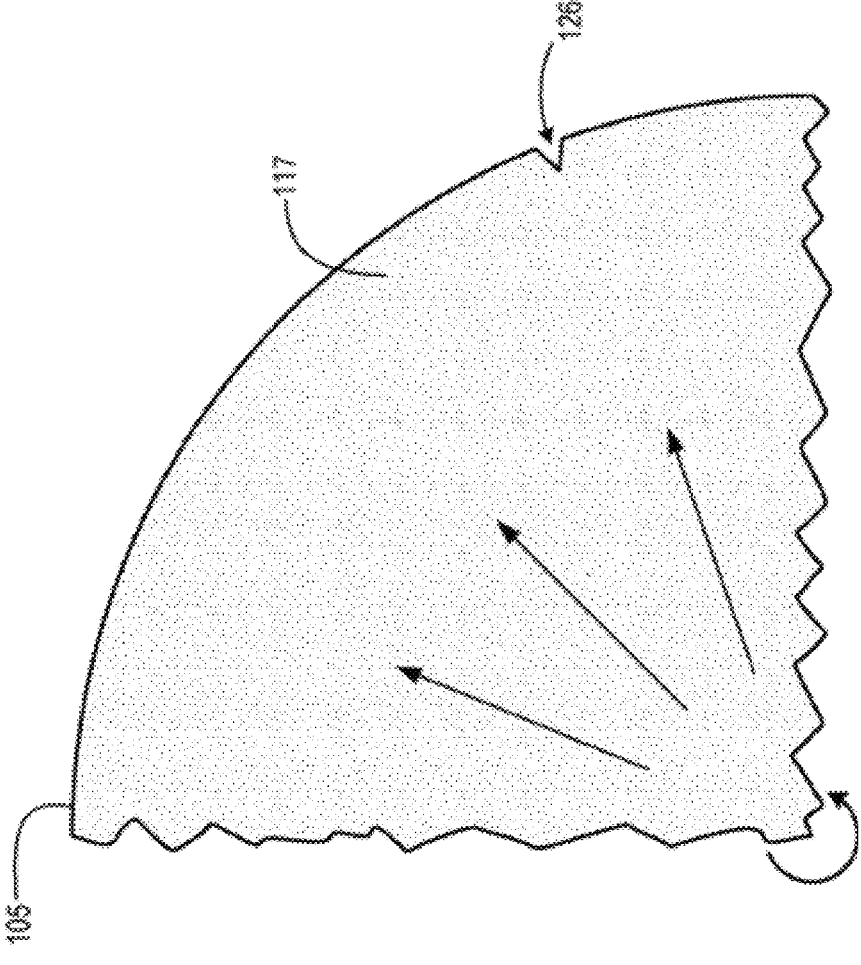
FIG. 5 is a top view of an example substrate segment showing flow of an example coating process according to embodiments disclosed herein.

FIG. 4 shows progression of liquid 117 after portions of liquid 117 have reached an outer edge of the substrate. Note that there are several regions of slivers (mouse bites) that are not yet covered with liquid 117. If a coating operation were stopped at this point then there would be insufficient coverage (i.e. defective). Each time the laser beam 131 hits a sliver, the behavior of scattered and reflected light would be erratic. By monitoring for this behavior, it can indicate that coverage is not complete. This can trigger flagging the substrate 105 as defective, or continuing to spin the substrate 105 if liquid 117 is still spreading outwards. Other actions can include increasing a rotational velocity of the substrate 105, or deposing more liquid 117 on the substrate 105. Because an aggregate surface area of non-covered regions can be accurately calculated or estimated based on evaluation of scattered or reflected light data, an additional volume to be dispensed can be accurately determined. The system controller 160 can then receive this feedback or instructions from the processor 150 and then control the dispense unit 118 to dispense an additional incremental volume sufficient to complete full coating coverage with a minimum additional volume dispensed. A result is illustrated in FIG. 5. Accordingly, a given substrate 105 can be fully coated with a minimum amount of extra liquid 117 dispensed.

Note that some coating processes are not coated on a perfectly flat substrate, but on a substrate that has structures (trenches, holes, mesa, et cetera). These patterned structures can modify light reflection and scattering. Even if a substrate has been properly covered, the scattered/reflected light can behave erratically. Thus, structures can be accounted for by comparison of its scattered/reflected light signal with that from a reference/target substrate that is considered defect-free. Scattered and/or reflected light behavior can be compared to the results from this reference substrate to determine when a substrate has been acceptably covered by film and if any defects are present. Essentially, any deviations in scattered/reflected light behavior from the target substrate can indicate the presence of an edge of a liquid. Alternatively or additionally, the detected light from an uncovered substrate can be used as a reference to that same substrate after it has been covered by a liquid. If the substrate has a similar pattern of reflected and scattered light before and after being covered by liquid, it can be an indication that the substrate has been acceptably covered. In another embodiment, the patterned structures can be accounted for by the processor or software and filtered out.

As can be appreciated, embodiments herein are not limited to coating photoresist on a wafer, but can apply to many additional microfabrication techniques using liquid deposited on a rotating substrate. For example, scattered/reflected light analysis herein can benefit developer dispenses. After a layer of photoresist has been exposed to patterned actinic radiation, soluble portions need to be developed. For film development, the objective is not merely to coat a substrate, but to dissolve and fully remove soluble material. With development, a greater volume of fluid is typically dispensed as compared to photoresist. The substrate can be monitored by analyzing scattered/reflected light. Erratic changes in detected light behavior can indicate a completed dissolution of soluble material, flow dynamics, and so forth.

Technics herein can benefit development with different developers including negative-tone developers. In practice it is common for approximately 6-8 ccs of negative-tone developer is dispensed, while around 30-50 ccs of other developers may be dispensed. Regardless of the developer used, de-wetting can be an issue during development, especially on the edge of the wafer. Development is slower than photoresist deposition. During development, solute can be picked up resulting in a weak photoresist solution. This solution can move along scribe lanes faster than across other areas. If the solution becomes saturated then photoresist can be deposited on the substrate again causing defects. Also, if the developer solution dries in one area before dissolved photoresist is carried off the substrate, then that photoresist can be re-deposited on the substrate. Thus, techniques herein can monitor clearing off of the developer from the substrate. Both the leading edge and trailing etch can be monitored. If gas is also used in clearing a wafer than an air jet interaction of the trailing edge (nitrogen puff) can be monitored in real time.

These techniques and monitoring can similarly apply to wet etching. Scattered/reflected light monitoring of fluids of the substrate can be used to make sure the dispense and contents of a developer are not changing due to a condition of surfactants changing. Etch rates and developer consumptions can be identified via pattern recognition of detected scattered/reflected light. By using such light detecting techniques to identify particular conditions (completed, turbulent), the dispense system can take corresponding actions such as to stop dispensing developer/etchant, or to slow rotational velocity in response to turbulent conditions. Minimizing an amount of developer or etchant used can reduce overall waste to benefit green processing initiatives. Certain developers can be expensive, so minimizing a volume dispensed is economically beneficial as well.

Embodiments herein similarly apply to cleans and rinses. Various rinse or clean operations can use piranha, SC1, SC2, deionized water, et cetera. Knowing a rinse or cleaning progression can have benefits including yield and throughput. Some rinsing liquids, such as deionized water, are relatively economical compared to resists and developers, and thus using substantially more than is needed may not have a large environmental or materials cost. But yield and throughput can benefit from real-time feedback. By knowing a precise completion point, rinses and etches can be stopped earlier compared to conventional techniques that need to run a safety stock or spin time to make sure a given substrate is fully cleaned or etched. Regarding defect reduction, some structures being micro-fabricated can be relatively delicate at certain stages. If a rinse liquid goes from laminar flow to turbulent flow, then this turbulent flow has the potential to damage or destroy structures being created. Thus monitoring for turbulent conditions can improve yield. Throughput can be increased by knowing exactly when a rinse or clean is completed. If a given rinse or clean process is completed and then immediately stopped based on analysis of scattered and/or reflected light feedback, then a number of wafers processed per hour can be increased. For some rinse operations, the system can be embodied to have an array of nozzles such as to spray liquid on the substrate.

Figure 6:
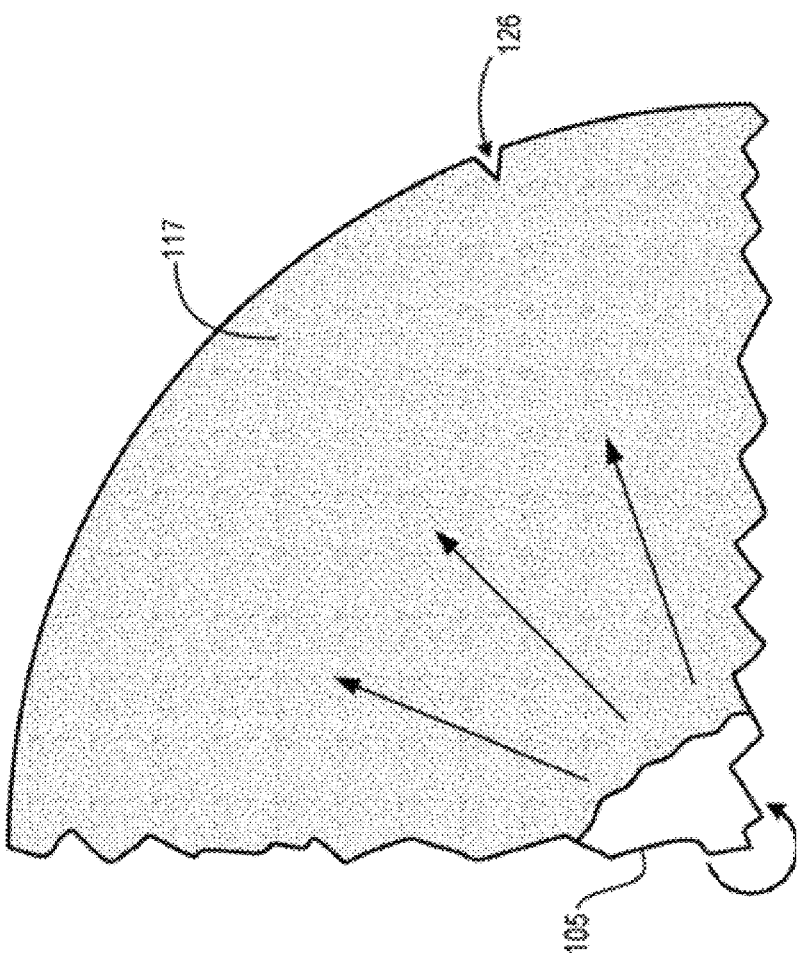
FIG. 6 is a top view of an example substrate segment showing flow of an example removal process according to embodiments disclosed herein.
Figure 7:
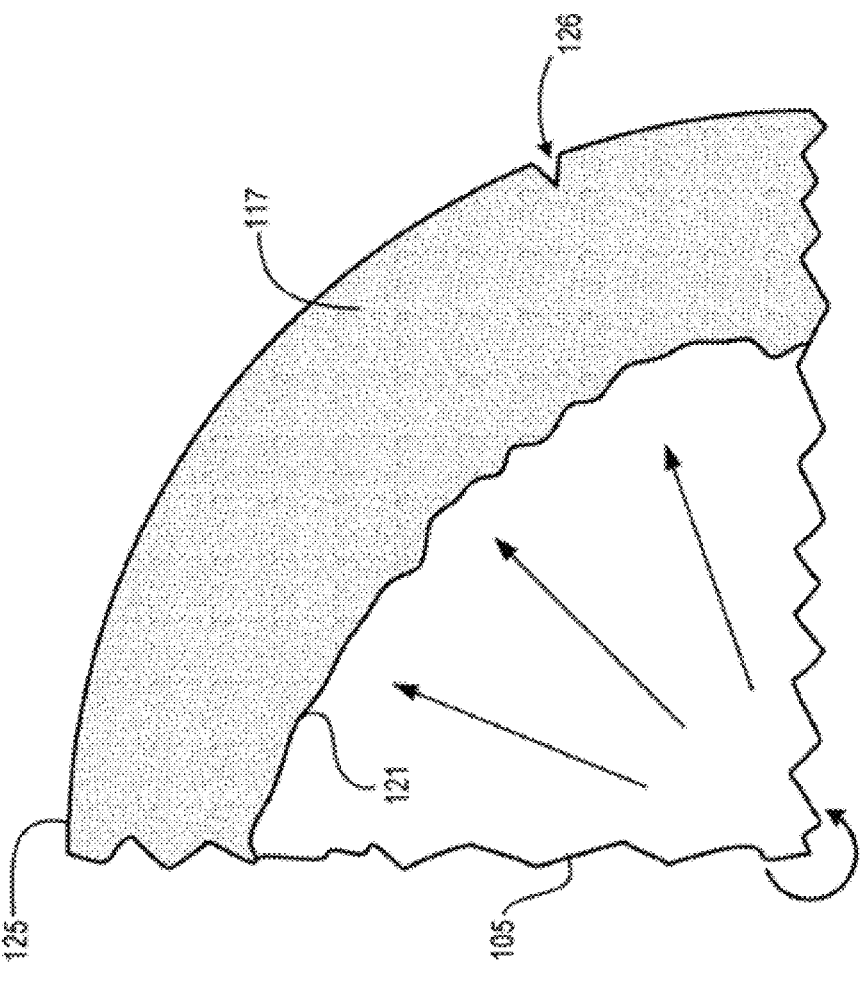
FIG. 7 is a top view of an example substrate segment showing flow of an example removal process according to embodiments disclosed herein.
Figure 8:
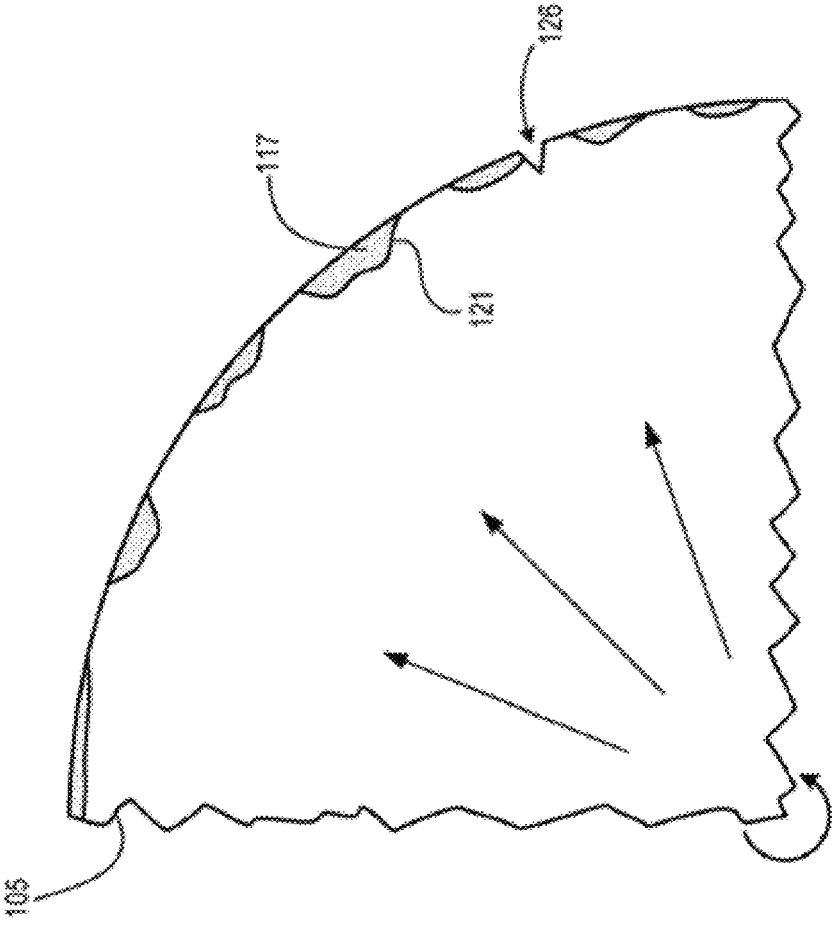
FIG. 8 is a top view of an example substrate segment showing flow of an example removal process according to embodiments disclosed herein.
Figure 9:
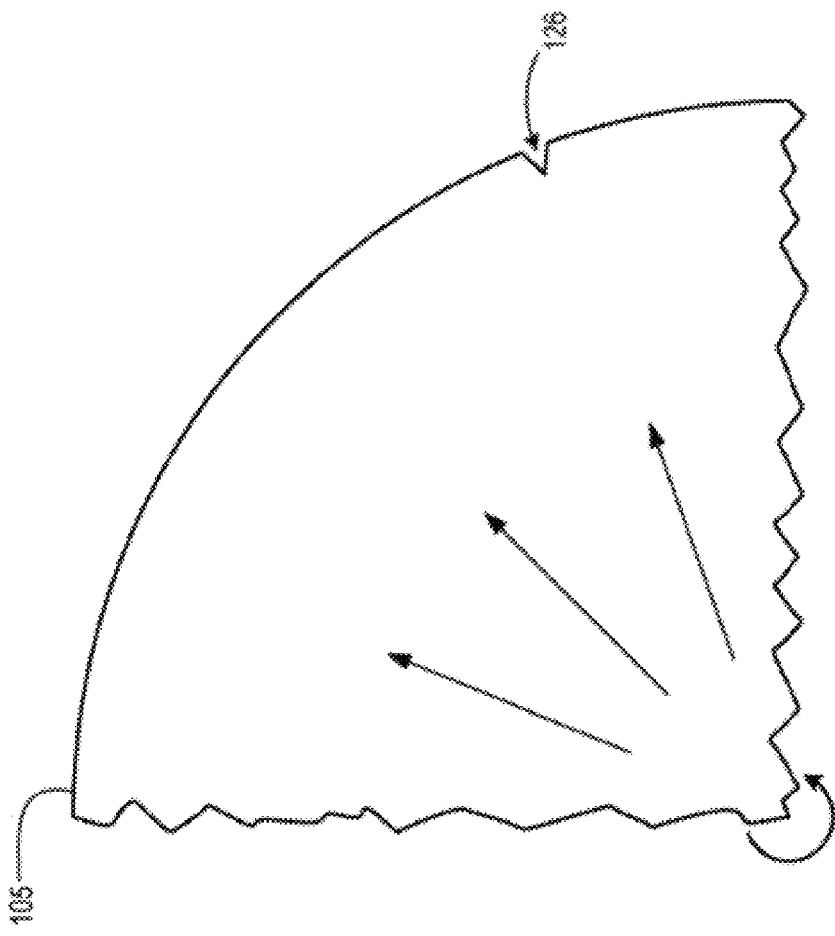
FIG. 9 is a top view of an example substrate segment showing flow of an example removal process according to embodiments disclosed herein.

FIGS. 6-9 illustrate an example development, etch, or rinse operation. In FIG. 6, liquid 117 has been stopped from being dispensed. As a rinse or developer, this fluid continues moving radially to the edge of the substrate 105. This can result in an inner meniscus 121 moving outwardly (FIG. 7). This inner meniscus 121 can be monitored such as to look for an undesirable flow condition that might damage devices thereon. If such a condition is identified, then the controller can reduce a rotational velocity. In FIG. 8 it can be identified that almost all liquid 117 has been spun off. The processor can calculate or identify when liquid 117 is indeed all off of the substrate (FIG. 9), and in response stop the corresponding dispense operation. Other operations can be executed. For example, if scattered/reflected light detection analysis shows re-deposition of material, then more liquid can be dispensed to dissolve/remove such material.

Accordingly, real-time control can be provided for accurate coating, development, etching, rinsing, and cleaning.

Figure 10:
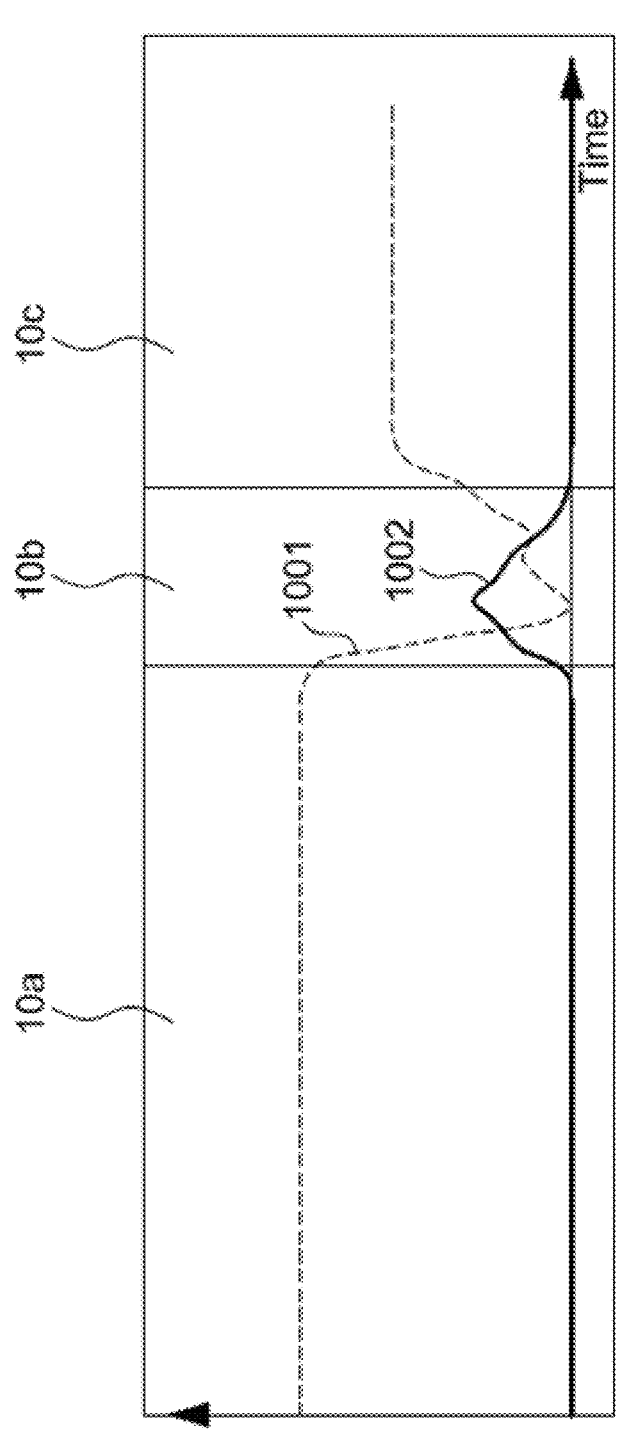
FIG. 10 illustrates behavior of reflected light and scattered light over time for a light directed at a flat substrate's edge as liquid spreads out over the substrate, particularly when liquid has not reached the edge of the substrate, liquid is at the edge of the substrate, and after the liquid has successfully covered the edge of the substrate.

Examples of results will not be discussed. Recall that with liquid coverage, a liquid front that is a moving edge of a liquid can cause a temporary change in reflected/scattered light when interacting with a laser beam. FIG. 10 illustrates an example of a pattern indicating a successful liquid coating, where a laser beam 131 was directed to the edge of a substrate 105. Reflected light 1001 and scattered light 1002 are detected by their respective detectors and graphed over time. Initially, as shown during time 10a, reflected light 1001 and scattered light 1002 show a fairly steady state behavior, which can indicate that the moving edge of the liquid 117 has not yet reached/interacted with the laser beam 131. Then, as shown during time 10b, reflected light 1001 and scattered light 1002 deviate from their previous behavior, and instead shows erratic, non-steady behavior, which can indicate that the moving edge of the liquid 117 has reached and is interacting with the laser beam 131. Compared to their respective magnitudes during time 10a, the amount of reflected light 1001 temporarily decreased, while the amount of scattered light 1002 temporarily increased. Lastly, if the liquid 117 has properly covered the edge of the substrate 105, behavior of the scattered light 1002 and reflected light 1001 will stabilize again, as shown in time 10c. The times in time 10a and time 10b can be summed by the processor 150 to obtain the actual coating time and compared to an expected coating time. If the expected coating time and actual coating time have a difference greater than a predetermined threshold, an error can be indicated or system operation adjusted.

Figure 11:
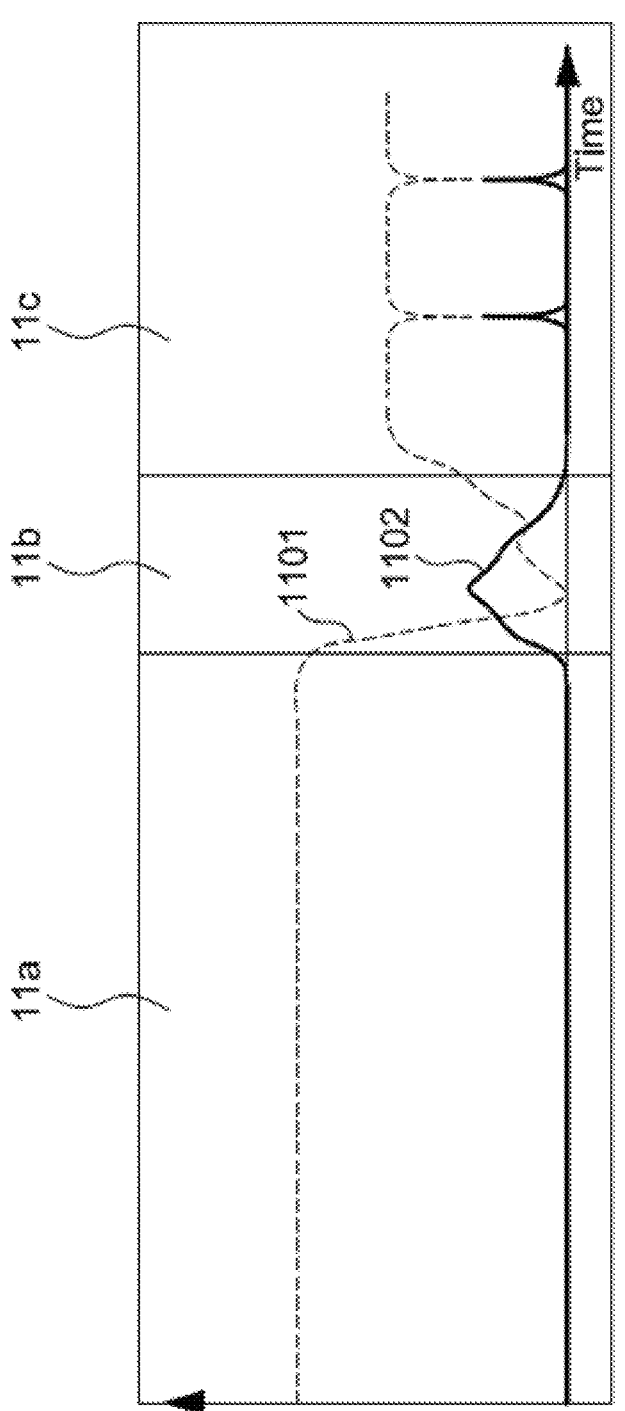
FIG. 11 illustrates behavior of reflected light and scattered light over time for a light directed at a flat substrate's edge as liquid spreads out over the substrate, particularly when liquid has not reached the edge of the substrate, liquid is at the edge of the substrate, and after the liquid has covered the edge of the substrate, but left behind a defect.

FIG. 11 illustrates an example of a monitored pattern in which a substrate 105 has been improperly coated, leaving behind striations. Light detectors were set up for capturing reflected light 1101 and scattered light 1102 from a laser beam 131 directed to the edge of a substrate 105. Initially, as shown during time 11*a*, reflected light 1101 and scattered light 1102 show steady state behavior, which can indicate that the moving edge of the liquid 117 has not yet reached/interacted with the laser beam 131. Then, as shown during time 11*b*, reflected light 1101 and scattered light 1102 show an erratic, non-steady behavior, which can indicate that the moving edge of the liquid 117 has reached/is interacting with the laser beam 131. Lastly, if the liquid 117 had properly covered the edge of the substrate 105, behavior of the scattered light 1102 and reflected light 1101 would stabilize in time 11*c* (as shown in FIG. 10 time 10*c*). Instead, during each rotation of the substrate 105, the striation and laser beam 131 interact, thereby causing downward spikes in reflected light 1101 and upward spikes in scattered light 1102, indicating an unsuccessfully coated substrate 105. This can be recognized by the processor 150 and trigger a subsequent action, such as marking the substrate 105 as defective, or adjusting a system operation.

Another embodiment herein is a method for dispensing liquid on a substrate. A substrate is rotated on a substrate holder about an axis. A liquid is dispensed on a working surface of the substrate while the substrate is being rotated on the substrate holder. Rotation of the substrate can cause the liquid to coat the working surface of the substrate progressing from a center portion of the substrate to an edge of the substrate. A laser beam is directed at an edge location on the working surface of the substrate. Light from the edge location of the substrate is monitored to identify a pattern of monitored light indicating that the liquid has reached the edge location on the substrate. An actual coating time of the liquid is identified, beginning from initiation of dispensing the liquid on the working surface until the liquid reaches the edge of the working surface. The actual coating time of the liquid is compared to an expected coating time. In response to identifying a difference greater than a predetermined threshold between the actual coating time and expected coating time, the dispense operation can be adjusted, or an error can be indicated. Multiple dispenses of multiple spin-on films can be monitored, and the actual coating time versus expected coating time of each deposited film can be compared.

Dispensing a liquid on a working surface of the substrate can include dispensing the liquid at a center portion of the substrate, with rotation of the substrate causing the liquid to spread outward. The outward spreading can be a liquid coating a substrate, or a liquid spreading off a substrate. In another embodiment, a liquid can be dispensed on a working surface of the substrate prior to the substrate being rotated on the substrate holder.

Directing a laser beam at an edge location on the working surface of the substrate can include directing the laser beam directly at the edge of a substrate, or approximately near the edge, such as a few millimeters inside the edge. Because the substrate is spinning, the entire edge around the substrate will be considered during the scattered/reflected light monitoring. In other embodiments, additional or alternative light sources can be used. Any laser (such as green or red) can be used as long as it does not activate a given photoresist being dispensed.

The location the laser beam is directed towards is the radius where coverage progression will be monitored for and defects detected at. Accordingly, additional laser beams can be directed on the working surface of the substrate. They can be directed to an interior portion of the substrate. Light from this interior location can be monitored to indicate when the liquid has reached that interior location, or that a defect is present at that interior location. An actual coating time can be identified and compared with an expected coating time for that interior location. This actual coating time can be used to predict when the entire substrate will be coated. The prediction can be made based on many different factors, such as how much of the substrate has already been covered, how much of the substrate still needs to be covered, the speed the substrate is rotating at, properties of the liquid (e.g. viscosity), etc. Furthermore, this predication can adjust system operations if it suggests that the substrate will not be properly coated. For example, if an interior portion was supposed to be coated in 1-2 seconds, but was instead coated in 3 seconds, this can suggest that coverage is lagging behind with the current operating settings. Thus, the operating setting can be adjusted, such as dispensing additional liquid on the substrate or increasing rotation speed of the substrate.

Monitoring light can include monitoring scattered light from the laser beam at an edge location. If the amount of scattered light briefly increases, this can suggest the liquid has reached the edge location on the substrate. If the amount of scattered light periodically spikes upwards, this can suggest a defect at the edge location on the substrate, such as a striation.

Monitoring light can include monitoring reflected light from the laser beam at an edge location. If the amount of reflected light briefly decreases, this can suggest the liquid has reached the edge location on the substrate. If the amount of scattered light periodically spikes downwards, this can suggest a defect at the edge location on the substrate, such as a striation.

Monitoring light can include monitoring both reflected light and scattered light from the laser beam at an edge location. Although behavior of scattered light or reflected light can be sufficient to indicate coverage and/or an error, both can be monitored, where behavior of the scattered light and reflected light can help verify each other's observations.

Monitoring light can include monitoring reflected light, scattered light, or both from any additional laser beams that are targeted to an interior portion of the substrate.

Identifying a pattern of monitored light indicating the liquid has reached the edge location on the substrate can include identifying when the monitored light changes behavior from generally being in a steady state to a non-steady state. In general, the amount of reflected light will decrease, and the amount of scattered light will decrease when a light interacts with the edge of a liquid. Further, identifying a pattern of monitored light indicating the liquid has properly covered the edge location on the substrate (i.e. not leaving behind any defects) can include identifying when the monitored light returns to being in a steady state. In addition, identifying a pattern of monitored light indicating a defect (e.g. striation) can include identifying when the monitored light periodically spikes. In general, a striation will cause scattered light to spike upwards, and reflected light to spike downwards. The spikes will be periodic assuming the substrate is rotating as a constant speed.

Identifying an actual coating time can include measuring the time between initiation of the liquid being dispensed on the working surface of the substrate to when the liquid has reached a target location of the working surface. This target location can be the edge or an interior portion, and is set by directing a laser beam to that target location. If multiple target locations are used, multiple coating times can be measured.

Comparing the actual coating time to an expected coating time can include, in response to identifying a difference greater than a predetermined threshold between the actual coating time and the expected coating time, adjusting the given dispense operation and/or indicating an error. The expected coating time and predetermined threshold can be based off previous successful coating times under similar operating conditions, or any other conventional techniques known in the art. A desired process yield can be a factor when determining the predetermined threshold.

Adjusting the dispense operation can include selectively modifying a volume of liquid dispensed on the working surface of the substrate. Adjusting the dispense operation can include selectively modifying a rotational velocity of the substrate holder. Adjusting the dispense operation of the liquid on the working surface of the substrate can include dispensing an additional volume that is minimized to an amount sufficient to complete full coating coverage of the working surface of the substrate.

Indicating an error can include flagging the substrate. The substrate can be marked for rework. The operating conditions, such as speed of substrate rotation, actual coating time, amount of liquid dispensed, etc. can be logged for future analysis and troubleshooting.

Monitoring multiple dispenses of multiple spin-on films can include comparing actual coating times and expected coating times for each deposited film. This information can be stored for analyzing, such as to make more accurate predictions for future expected coating times, more optimal predetermined thresholds, more optimal operating conditions, etc.

Multiple light sources can be monitored. For example, Any laser (such as green or red) can be used as long as it does not activate a given photoresist being dispensed. Accordingly, monitoring light from the edge portion can include monitoring light from multiple light sources.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for dispensing liquid on a substrate, the method comprising:

rotating a substrate on a substrate holder about an axis;

dispensing a liquid on a working surface of the substrate while the substrate is being rotated on the substrate holder, rotation of the substrate causing the liquid to coat the working surface of the substrate progressing from a center portion of the substrate to an edge of the substrate;

directing a first laser beam at an edge of the working surface of the substrate;

directing a second laser beam at an interior portion of the working surface of the substrate;

monitoring scattered light from the first laser beam directed at the edge of the working surface of the substrate and scattered light or reflected light from the second laser beam directed at the interior portion of the working surface of the substrate to identify a pattern of monitored light indicating that the liquid has reached the edge of the working surface of the substrate;

identifying an actual coating time of the liquid beginning from initiation of dispensing the liquid on the working surface until the liquid reaches the edge of the working surface; and comparing the actual coating time of the liquid to an expected coating time of the liquid.

2. The method of claim 1, wherein monitoring the scattered light from the first laser beam directed at the edge of the working surface of the substrate includes monitoring the scattered light and reflected light from the first laser beam at the edge of the working surface of the substrate.

3. The method of claim 1, further comprising:

adjusting a given dispense operation based on comparing the actual coating time of the liquid to the expected coating time of the liquid.

4. The method of claim 1, further comprising:

in response to identifying a difference greater than a predetermined threshold between the actual coating time and the expected coating time, adjusting a given dispense operation.

5. The method of claim 4, wherein adjusting the given dispense operation includes dispensing more of the liquid.

6. The method of claim 4, wherein adjusting the given dispense operation includes increasing rotational velocity of the substrate.

7. The method of claim 4, further comprising:

in response to identifying a difference greater than a predetermined threshold between the actual coating time and the expected coating time, indicating an error.

8. The method of claim 1, further comprising:

monitoring multiple dispenses of multiple spin-on films and comparing actual coating time and expected coating time of each deposited film.

9. The method of claim 1, further comprising:

monitoring light from the first laser beam directed at the edge of the working surface of the substrate to identify the pattern of monitored light indicating that a film formed from the liquid has a defect.

10. The method of claim 1, wherein monitoring the scattered light from the first laser beam directed at the edge of the working surface of the substrate includes monitoring light from multiple light sources.

11. A method for dispensing liquid on a substrate, the method comprising:

rotating a substrate on a substrate holder about an axis;

dispensing a liquid on a working surface of the substrate while the substrate is being rotated on the substrate holder, rotation of the substrate causing the liquid to coat the working surface of the substrate progressing from a center portion of the substrate to an edge of the substrate;

directing a first laser beam at an edge of the working surface of the substrate;

directing a second laser beam at an interior portion of the working surface of the substrate;

monitoring reflected light from the first laser beam directed at the edge of the working surface of the substrate and scattered light or reflected light from the second laser beam directed at the interior portion of the working surface of the substrate to identify a pattern of monitored light indicating that the liquid has reached the edge of the working surface of the substrate;

identifying an actual coating time of the liquid beginning from initiation of dispensing the liquid on the working surface until the liquid reaches the edge of the working surface; and comparing the actual coating time of the liquid to an expected coating time of the liquid.

12. The method of claim 11, wherein monitoring the reflected light from the first laser beam directed at the edge of the working surface of the substrate includes monitoring the reflected light and scattered light from the first laser beam at the edge of the working surface of the substrate.

13. A method for dispensing liquid on a substrate, the method comprising:

rotating a substrate on a substrate holder about an axis;

dispensing a liquid on a working surface of the substrate while the substrate is being rotated on the substrate holder, rotation of the substrate causing the liquid to coat the working surface of the substrate progressing from a center portion of the substrate to an edge of the substrate;

directing a laser beam at an edge of the working surface of the substrate;

monitoring both scattered light from the laser beam and reflected light directed at the edge of the working surface of the substrate to identify a pattern of monitored light indicating that the liquid has reached the edge of the working surface of the substrate;

identifying an actual coating time of the liquid beginning from initiation of dispensing the liquid on the working surface until the liquid reaches the edge of the working surface; and comparing the actual coating time of the liquid to an expected coating time of the liquid.

* * * * *